(12) United States Patent
Kim et al.

(10) Patent No.: US 12,224,751 B2
(45) Date of Patent: Feb. 11, 2025

(54) SEMICONDUCTOR DEVICE AND SEMICONDUCTOR SYSTEM HAVING THE SAME

(71) Applicant: Samsung Electronics Co., Ltd., Suwon-si (KR)

(72) Inventors: Garoom Kim, Suwon-si (KR); Jae-Woo Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/085,185

(22) Filed: Dec. 20, 2022

(65) Prior Publication Data

US 2023/0396241 A1    Dec. 7, 2023

(30) Foreign Application Priority Data

Jun. 3, 2022    (KR) .................. 10-2022-0067983

(51) Int. Cl.
*H03K 3/3562* (2006.01)
*H03K 3/012* (2006.01)
*H03K 3/037* (2006.01)

(52) U.S. Cl.
CPC ........... *H03K 3/0372* (2013.01); *H03K 3/012* (2013.01); *H03K 3/35625* (2013.01)

(58) Field of Classification Search
CPC ... H03K 3/0372; H03K 3/012; H03K 3/35625
See application file for complete search history.

(56) References Cited

U.S. PATENT DOCUMENTS

| | | | |
|---|---|---|---|
| 5,999,030 A | 12/1999 | Inoue | |
| 6,429,713 B2 | 8/2002 | Nakaizumi | |
| 6,459,302 B2 | 10/2002 | Nakaizumi | |
| 7,408,393 B1 | 8/2008 | Jain et al. | |
| 9,148,149 B2 | 9/2015 | Cheng et al. | |
| 9,503,062 B2 | 11/2016 | Singh et al. | |
| 2008/0218234 A1* | 9/2008 | Jain | H03K 3/356156 327/202 |
| 2020/0151299 A1* | 5/2020 | Chen | G06F 30/333 |
| 2020/0313661 A1* | 10/2020 | Kimura | H03K 3/012 |
| 2023/0050338 A1* | 2/2023 | Kong | H03K 3/35625 |

FOREIGN PATENT DOCUMENTS

KR    101091488 B1    12/2011

OTHER PUBLICATIONS

Hyun, D. et. al., "Library Optimization for Near-Threshold Voltage Design," 2018 IEEE International Symposium on Circuits and Systems (ISCAS), 2018, pp. 1-4.
Joshi, V. et. al., "Soft-edge flip-flops for improved timing yield: design and optimization," 2007 IEEE/ACM International Conference on Computer-Aided Design, 2007, pp. 667-673.

* cited by examiner

*Primary Examiner* — Sibin Chen
(74) *Attorney, Agent, or Firm* — Muir Patent Law, PLLC

(57) ABSTRACT

Disclosed is a semiconductor device which includes at least one flip-flop. The flip-flop includes a first latch that includes a first data path receiving input data in response to a transmission signal and outputting middle data, and a first feedback path feeding back the middle data, and a second latch that includes a second data path receiving the middle data in response to the transmission signal and outputting output data, and a second feedback path feeding back the output data, and at least one of the first feedback path and the second feedback path is disabled prior to the first data path or the second data path.

12 Claims, 11 Drawing Sheets

SEMICONDUCTOR DEVICE AND SEMICONDUCTOR SYSTEM HAVING THE SAME

CROSS-REFERENCE TO RELATED APPLICATIONS

This application claims priority under 35 U.S.C. § 119 to Korean Patent Application No. 10-2022-0067983 filed on Jun. 3, 2022, in the Korean Intellectual Property Office, the disclosures of which are incorporated by reference herein in their entireties.

BACKGROUND

Embodiments of the present disclosure described herein relate to a semiconductor device, and more particularly, relate to a semiconductor device and a semiconductor system including the same.

There is an increasing demand for a low-power and small-size semiconductor device or semiconductor system. In the event that a difference between an operating voltage (i.e., a power supply voltage) and a threshold voltage of a circuit element (or component) constituting the semiconductor device is small, an abnormal operation in which an operation required for the circuit element is not properly performed may occur. For this reason, there is a limitation in lowering the operating voltage of the semiconductor device or semiconductor system.

SUMMARY

Embodiments of the present disclosure provide a semiconductor device and a semiconductor system stably operating at a low power.

According to an embodiment, a semiconductor device may include at least one flip-flop including a first flip-flop. The first flip-flop may include a first latch that includes a first data path receiving input data in response to a transmission signal and outputting middle data, and a first feedback path feeding the middle data back to the first data path, and a second latch that includes a second data path receiving the middle data in response to the transmission signal and outputting output data, and a second feedback path feeding the output data back to the second data path, and at least one of the first feedback path and the second feedback path may be disabled prior to enabling the first data path or the second data path.

The flip-flop further may include a clock buffer that receives a reference clock signal and generates an inverse clock signal and a delay clock signal from the reference clock signal as the transmission signal.

The second data path may include a second transmission gate that is connected to the first latch and includes a second PMOS transmission transistor gated by the inverse clock signal and a second NMOS transmission transistor gated by the delay clock signal, and a second data inverter that is connected to the second transmission gate and inverts the middle data transmitted from the second transmission gate so as to be output as the output data.

The second feedback path may include a second feedback inverter that includes a (2-1)-th PMOS feedback transistor and a (2-2)-th NMOS feedback transistor each gated by the output data, a (2-2)-th PMOS feedback transistor gated by the reference clock signal, and a (2-1)-th NMOS feedback transistor gated by the inverse clock signal.

The second data path may include a (2-1)-th data inverter that is connected to the first latch and includes a (2-1)-th PMOS data transistor and a (2-2)-th NMOS data transistor each gated by the middle data, a (2-2)-th PMOS data transistor gated by the inverse clock signal, and a (2-1)-th NMOS data transistor gated by the delay clock signal, and a (2-2)-th data inverter that is connected to the (2-1)th data inverter, inverts an output of the (2-1)-th data inverter, and generates the output data. The second feedback path may include a second feedback inverter that includes a (2-1)-th PMOS feedback transistor and a (2-2)-th NMOS feedback transistor each gated by the output data, a (2-2)-th PMOS feedback transistor gated by the reference clock signal, and a (2-1)-th NMOS feedback transistor gated by the inverse clock signal.

The second data path may include a second data inverter that is connected to the first latch and includes a (2-1)-th PMOS data transistor and a (2-2)-th NMOS data transistor each gated by the middle data, a (2-2)-th PMOS data transistor gated by the inverse clock signal, and a (2-1)-th NMOS data transistor gated by the delay clock signal, and the second feedback path may include a (2-1)-th feedback inverter that is connected to the second data inverter and inverts an output of the second data inverter, and a (2-2)-th feedback inverter that is connected to the (2-1)-th feedback inverter and includes a (2-1)-th PMOS feedback transistor and a (2-2)-th NMOS feedback transistor each gated by an output of the (2-1)-th feedback inverter, a (2-2)-th PMOS feedback transistor gated by the reference clock signal, and a (2-1)-th NMOS feedback transistor gated by the inverse clock signal.

The first data path may include a first transmission gate that includes a first PMOS transmission transistor gated by the delay clock signal and a first NMOS transmission transistor gated by the inverse clock signal, and a first data inverter that is connected to the first transmission gate and inverts the input data transmitted from the first transmission gate so as to be output as the middle data.

The first feedback path may include a first feedback inverter that includes a (1-1)-th PMOS feedback transistor and a (1-2)-th NMOS feedback transistor each gated by the middle data, a (1-2)-th PMOS feedback transistor gated by the inverse clock signal, and a (1-1)-th NMOS feedback transistor gated by the delay clock signal.

The clock buffer may include a first clock inverter and a second clock inverter connected with each other in series. The first clock inverter may receive the reference clock signal and generate the inverse clock signal. The second clock inverter may receive the inverse clock signal and generate the delay clock signal.

The semiconductor device may further include a clock gating circuit that receives an input clock signal and outputs, in response to an enable signal, the input clock signal as the reference clock signal.

The flip-flop may further include a clock buffer that receives a reference clock signal, generates an inverse clock signal, a delay clock signal, and a delay inverse signal from a reference clock signal, and outputs the delay clock signal and the delay inverse signal as the transmission signal.

The second data path may include a second transmission gate that is connected to the first latch and includes a second PMOS transmission transistor gated by the delay inverse signal and a second NMOS transmission transistor gated by the delay clock signal, and a second data inverter that is connected to the second transmission gate, inverts the middle data transmitted from the second transmission gate, and generates the output data.

The second feedback path may include a second feedback inverter that includes a (2-1)-th PMOS feedback transistor and a (2-2)-th NMOS feedback transistor each gated by the output data, a (2-2)-th PMOS feedback transistor gated by the delay clock signal, and a (2-1)-th NMOS feedback transistor gated by the inverse clock signal.

The first data path may include a first transmission gate that includes a first PMOS transmission transistor gated by the delay clock signal and a first NMOS transmission transistor gated by the delay inverse clock signal, and a first data inverter that is connected to the first transmission gate, inverts the input data transmitted from the first transmission gate, and generates the middle data. The first feedback path may include a first feedback inverter that includes a (1-1)-th PMOS feedback transistor and a (1-2)-th NMOS feedback transistor each gated by the middle data, a (1-2)-th PMOS feedback transistor gated by the delay inverse clock signal, and a (1-1)-th NMOS feedback transistor gated by the delay clock signal.

The semiconductor device may further include a combinational logic circuit. The at least one flip-flop includes a plurality of flip-flops connected with each other in series. An output of each flip-flop of the plurality of flip-flops is connected to the combinational logic circuit to constitute a scan chain circuit. The scan chain circuit may receive a scan input and generate, in response to a shift enable signal, to generate a scan output.

According to an embodiment, a semiconductor device may include at least one D flip-flop including a first D flip-flop. The first D flip-flop may include a first transmission gate that is gated by a transmission signal and transmits input data of a first node to a second node, a master latch that includes a first data inverter to invert the input data of the second node and output the input data as middle data to a third node, and a first feedback inverter that is connected to the first data inverter and feeds the middle data of the third node back to the second node, a second transmission gate that is gated by the transmission signal and transmits the middle data of the third node to a fourth node, and a slave latch that includes a second data inverter that is connected to the fourth node, inverts the middle data of the fourth node, and outputs the middle data of the fourth node as output data to a fifth node, and a second feedback inverter that is connected to the fourth node and the fifth node and feeds the output data of the fifth node back to the fourth node. A pull-up operation of the second feedback inverter may be disabled before a pull-down operation of the second transmission gate at the fourth node is enabled.

The semiconductor device may further include a clock buffer that receives a reference clock signal and generates an inverse clock signal and a delay clock signal from the reference clock signal as the transmission signal.

The first transmission gate may include a first PMOS transmission transistor that is gated by the delay clock signal, and a first NMOS transmission transistor that is gated by the inverse clock signal, and the second transmission gate may include a second PMOS transmission transistor that is gated by the inverse clock signal, and a second NMOS transmission transistor that is gated by the delay clock signal.

The second feedback inverter may include a (2-1)-th PMOS feedback transistor that includes a first source/drain connected with a power supply voltage and a gate connected with the fifth node, a (2-2)-th PMOS feedback transistor that includes a first source/drain connected with a second source/drain of the (2-1)-th PMOS feedback transistor, a second source/drain connected with the fourth node, and a gate connected with the reference clock signal, a (2-2)-th NMOS feedback transistor that includes a first source/drain connected with a ground voltage and a gate connected with the fifth node, and a (2-1)-th NMOS feedback transistor that includes a first source/drain connected with the fourth node, a second source/drain connected with a second source/drain of the (2-2)-th NMOS feedback transistor, and a gate connected with the inverse clock signal.

According to an embodiment, a semiconductor system may include the semiconductor device.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure will be described in detail and clearly to such an extent that an ordinary one in the art easily implements the invention.

Figure 1:
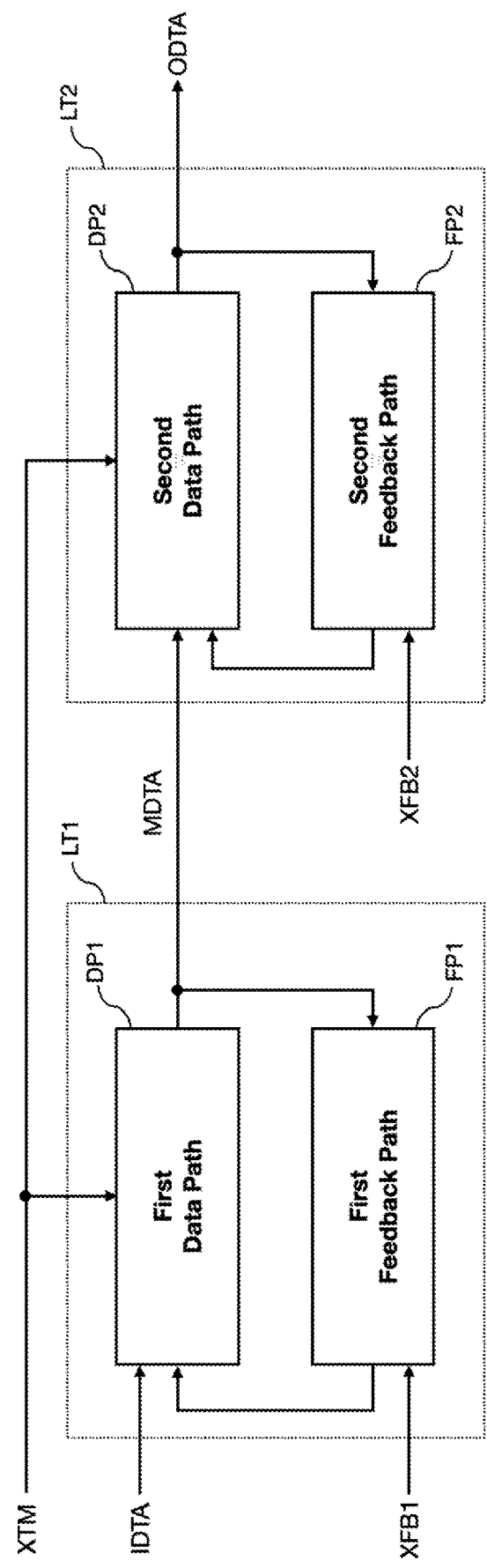
FIG. 1 is a diagram illustrating a semiconductor device according to an embodiment of the present disclosure.

FIG. 1 is a diagram illustrating a semiconductor device according to an embodiment of the present disclosure.

Referring to FIG. 1, a semiconductor device 100 according to an embodiment of the present disclosure may be implemented with a structure that allows an operation required for the semiconductor device 100 or a processor or electronic device including the semiconductor device 100 to perform stably at a low power. For example, the semiconductor device 100 according to an embodiment of the present disclosure may include at least one flip-flop FF.

The flip-flop FF according to an embodiment of the present disclosure may include a first latch LT1 and a second latch LT2.

The first latch LT1 may include a first data path DP1 and a first feedback path FP1. The first data path DP1 may receive input data IDTA in response to a transmission signal XTM and may output the input data IDTA thus received as middle data MDTA. The first feedback path FP1 may feed the middle data MDTA back to the first data path DP1. The second latch LT2 may include a second data path DP2 and a second feedback path FP2. Like the first data path DP1, the second data path DP2 may operate in response to the transmission signal XTM. The second data path DP2 may receive the middle data MDTA in response to the transmission signal XTM and may output the middle data MDTA thus received as output data ODTA.

The first feedback path FP1 may be enabled or disabled in response to a first feedback signal)(FBI, and the second feedback path FP2 may be enabled or disabled in response to a second feedback signal XFB2.

At least one of the first latch LT1 and the second latch LT2 may adjust (or tune) the enable timing of the first data path DP1 or the second data path DP2 included therein and the disable timing of the first feedback path FP1 or the second feedback path FP2 included therein, and thus, an abnormal operation due to simultaneous transition (i.e., simultaneous enabling) of a data path and a feedback path in the low operating voltage (i.e., a power supply voltage) of the semiconductor device 100 may be prevented.

In the first latch LT1 and the second latch LT2, the semiconductor device 100 according to an embodiment of the present disclosure may perform the above operation by adjusting a timing relationship among the transmission signal XTM associated with the first data path DP1 or the second data path DP2, the first feedback signal XFB1 associated with the first feedback path FP1, and the second feedback signal XFB2 associated with the second feedback path FP2. For example, with reference to the transmission signal XTM, the timing point at which the first data path DP1 or the second data path DP2 is activated may be determined. With reference to the first feedback signal XFB1, the timing point at which the first feedback path FP1 is activated may be determined. With reference to the second feedback signal XFB2, the timing point at which the second feedback path FP2 is activated may be determined. A timing relationship among the transmission signal XTM, the first feedback signal)(FBI, and the second feedback signal XFB2 may control which path among the first and second data paths DP1 and DP2, and the first and second feedback path FP1 and FP2 is enabled or disabled. Such timing relationship will be described with reference to FIG. 5.

The transmission signal XTM, the first feedback signal XFB1, and the second feedback signal XFB2 may be provided as much as the number of elements (or components) that are included in the first data path DP1 and the first feedback path FP1 and participate in the enable or disable of the second data path DP2 and the second feedback path FP2. For example, when the first feedback path FP1 includes two elements participating in the above enable or disable, two first feedback signals)(FBI may be provided. In an embodiment, each of the transmission signal XTM, the first feedback signal XFB1, and the second feedback signal XFB2 may be provided as much as the number of elements (or components) that are included in a corresponding path of the first and second data paths DP1 and DP2 and the first and second feedback paths FP1 and FP2 and that are involved in enabling or disabling the corresponding path. For example, when two elements of the first feedback path FP1 (e.g., a (1-2)-th PMOS feedback transistor PF1-2 and a (1-1)-th NMOS feedback transistor NF1-1 in FIG. 2) participate in enabling or disabling of the first feedback path FP1, the first feedback signal XFB1 associated with the first feedback path FP1 may have two first feedback signals (e.g., an inverse clock signal CKn and a delay clock signal CKb in FIG. 2) applied to the two elements, respectively.

Figure 2:
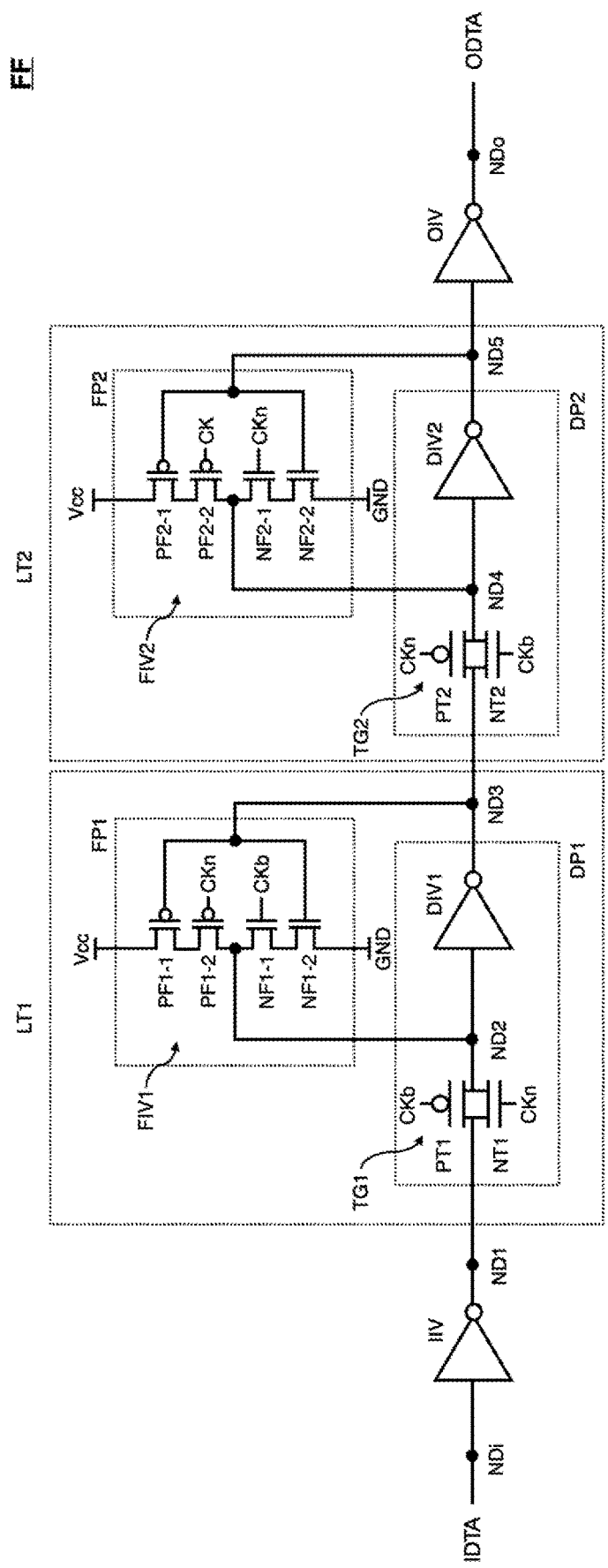
FIG. 2 is a diagram illustrating a flip-flop according to an embodiment of the present disclosure.
Figure 3:
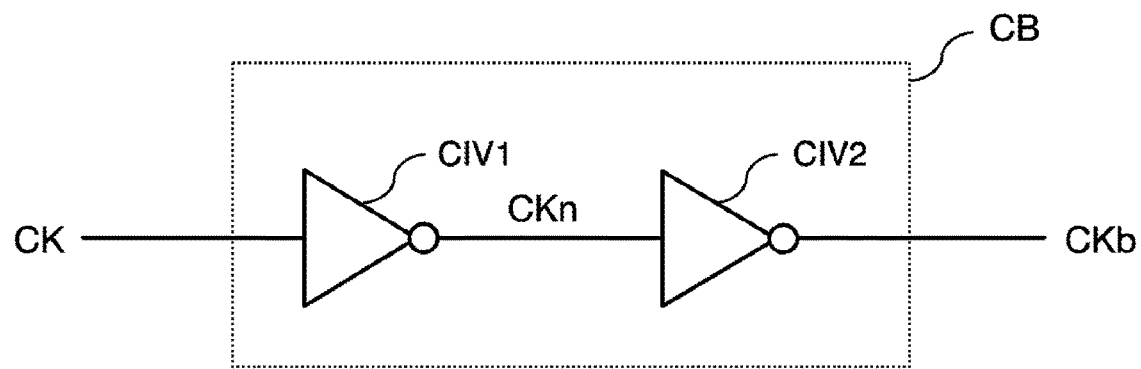
FIG. 3 is a diagram illustrating a clock buffer according to an embodiment of the present disclosure.

FIG. 2 is a diagram illustrating a flip-flop according to an embodiment of the present disclosure, and FIG. 3 is a diagram illustrating a clock buffer according to an embodiment of the present disclosure.

Referring to FIGS. 1 to 3, each of the first latch LT1 and the second latch LT2 of the flip-flop FF according to an embodiment of the present disclosure may be a D flip-flop including a master latch and a slave latch. The flip-flop FF according to an embodiment of the present disclosure may adjust the enable or disable timing of the second data path DP2 and the second feedback path FP2 in the second latch LT2.

The first latch LT1 may include the first data path DP1 provided between a first node ND1 and a third node ND3, and the first feedback path FP1 provided between a second node ND2 and the third node ND3.

The first data path DP1 may include a first transmission gate TG1 and a first data inverter DIV1. The first transmission gate TG1 may include a first PMOS transmission transistor PT1 and a first NMOS transmission transistor NT1. The first data inverter DIV1 may invert the input data IDTA transmitted from the first transmission gate TG1 and may output the middle data MDTA as an inversion result. The first data inverter DIV1 may include a PMOS transistor (not illustrated) and an NMOS transistor (not illustrated) that are gated by a voltage of the second node ND2 and are sequentially connected between a power supply voltage Vcc and a ground voltage GND.

The first feedback path FP1 may include a first feedback inverter FIV1 that feeds an output of the first data inverter DIV1, that is, the middle data MDTA of the third node ND3 back to the second node ND2. The first feedback inverter FIV1 may be implemented with a three-phase inverter. For example, the first feedback inverter FIV1 may include a (1-1)-th PMOS feedback transistor PF1-1, a (1-2)-th PMOS feedback transistor PF1-2, a (1-1)-th NMOS feedback transistor NF1-1, and a (1-2)-th NMOS feedback transistor NF1-2 between the power supply voltage Vcc and the ground voltage GND. The (1-1)-th PMOS feedback transistor PF1-1 and the (1-2)-th NMOS feedback transistor NF1-2 may be gated by the middle data MDTA of the third node ND3, and the (1-2)-th PMOS feedback transistor PF1-2 and the (1-1)-th NMOS feedback transistor NF1-1 may be gated by the first feedback signal XFB1. In this case, first ends (i.e., source/drains) of the (1-2)-th PMOS feedback transistor PF1-2 and (1-1)-th NMOS feedback transistor NF1-1 that are electrically connected with each other may be electrically connected with the second node ND2.

The first feedback signal XFB1 may be the same signal as the transmission signal XTM. Accordingly, the semiconductor device 100 according to an embodiment of the present disclosure may use signals whose kinds are small in number and thus may optimize the signal routing.

The second latch LT2 may include the second data path DP2 provided between the third node ND3 and a fifth node ND5, and the second feedback path FP2 provided between a fourth node ND4 and the fifth node ND5.

The second data path DP2 may include a second transmission gate TG2 and a second data inverter DIV2. The second transmission gate TG2 may include a second PMOS transmission transistor PT2 and a second NMOS transmission transistor NT2. The second data inverter DIV2 may invert the middle data MDTA transmitted from the second transmission gate TG2 and may output the output data ODTA as an inversion result. The second data inverter DIV2 may include a PMOS transistor (not illustrated) and an NMOS transistor (not illustrated) that are gated by a voltage of the fourth node ND4 and are sequentially connected between the power supply voltage and the ground voltage.

The second feedback path FP2 may include a second feedback inverter FIV2 that feeds an output of the second data inverter DIV2, that is, the output data ODTA of the fifth node ND5 back to the fourth node ND4. The second feedback inverter FIV2 may be implemented with a three-phase inverter. For example, the second feedback inverter FIV2 may include a (2-1)-th PMOS feedback transistor PF2-1, a (2-2)-th PMOS feedback transistor PF2-2, a (2-1)-th NMOS feedback transistor NF2-1, and a (2-2)-th NMOS feedback transistor NF2-2 between the power supply voltage Vcc and the ground voltage GND. The (2-1)-th PMOS feedback transistor PF2-1 and the (2-2)-th NMOS feedback transistor NF2-2 may be gated by the output data ODTA of the fifth node ND5, and the (2-2)-th PMOS feedback transistor PF2-2 and the (2-1)-th NMOS feedback transistor NF2-1 may be gated by the second feedback signal XFB2. In this case, first ends (i.e., source/drains) of the (2-2)-th PMOS feedback transistor PF2-2 and (2-1)-th NMOS feedback transistor NF2-1 that are electrically connected with each other may be electrically connected with the fourth node ND4.

The second feedback signal XFB2 may include a signal that is common to the transmission signal XTM or the first feedback signal XFB1. For example, the second feedback signal XFB2 has the reference clock signal CK and the inverse clock signal CKn, and the first feedback signal XFB1 has the inverse clock signal CKn and the delay clock signal CKb. The inverse clock signal CKn may be a common clock signal that is included in both first feedback signal) (FBI and the second feedback signal XFB2. Accordingly, the semiconductor device 100 according to an embodiment of the present disclosure may use signals whose kinds are small in number and thus may be easy to implement the signal routing.

The transmission signal XTM, the first feedback signal XFB1, and the second feedback signal XFB2 may be a signal corresponding to a reference clock signal CK applied to the flip-flop FF.

The flip-flop FF according to an embodiment of the present disclosure may further include a clock buffer CB that generates an inverse clock signal CKn and a delay clock signal CKb from the reference clock signal CK so as to be output as the transmission signals XTM. The clock buffer CB may include a first clock inverter CIV1 that outputs the reference clock signal CK as the inverse clock signal CKn and a second clock inverter CIV2 that outputs the inverse clock signal CKn as the delay clock signal CKb.

The inverse clock signal CKn that is one of the transmission signals XTM may be applied to a gate of the first NMOS transmission transistor NT1 of the first transmission gate TG1 and a gate of the second PMOS transmission transistor PT2 of the second transmission gate TG2. The delay clock signal CKb that is the other of the transmission signals XTM may be applied to a gate of the first PMOS transmission transistor PT1 of the first transmission gate TG1 and a gate of the second NMOS transmission transistor NT2 of the second transmission gate TG2.

The inverse clock signal CKn and the delay clock signal CKb may also be applied to the first feedback path FP1 as the first feedback signals XFB1. That is, the inverse clock signal CKn that is one of the first feedback signals XFB1 may be applied to a gate of the (1-2)-th PMOS feedback transistor PF1-2 of the first feedback path FP1, and the delay clock signal CKb that is the other of the first feedback signals XFB1 may be applied to a gate of the (1-1)-th NMOS feedback transistor NF1-1 of the first feedback path FP1.

In contrast, the second feedback signal XFB2 may include the inverse clock signal CKn and the reference clock signal CK. The inverse clock signal CKn that is one of the second feedback signals XFB2 may be applied to a gate of the (2-1)-th NMOS feedback transistor NF2-1 of the second feedback path FP2. The reference clock signal CK that is the other of the second feedback signals XFB2 may be applied to a gate of the (2-2)-th PMOS feedback transistor PF2-2 of the second feedback path FP2.

Figure 4:
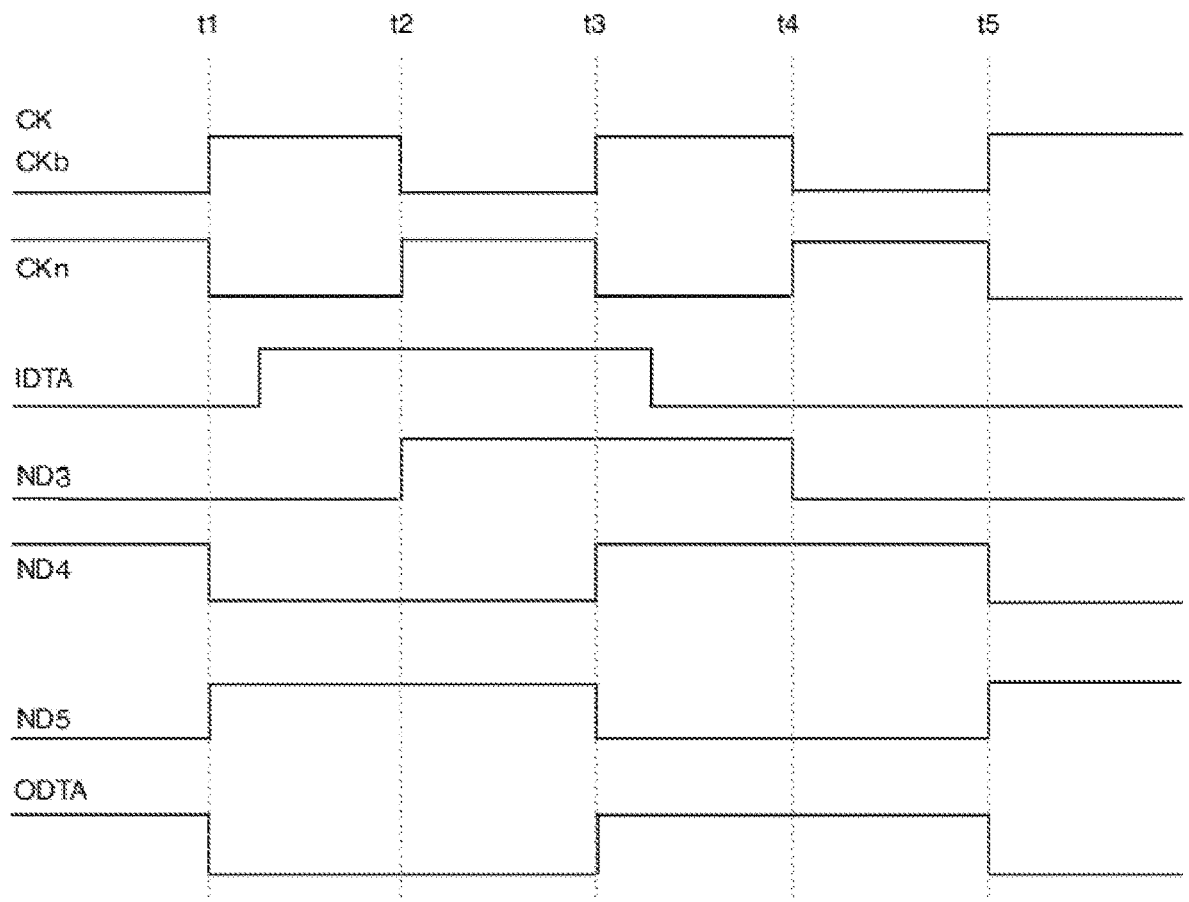
FIG. 4 is a diagram illustrating an operation of a flip-flop according to an embodiment of the present disclosure.

FIG. 4 is a diagram illustrating an operation of a flip-flop according to an embodiment of the present disclosure.

Referring to FIGS. 2 and 4, after a set-up operation of the flip-flop FF according to an embodiment of the present disclosure is completed, the reference clock signal CK and the delay clock signal CKb may transition to logical high at a first time point t1, a third time point t3, and a fifth time point t5, and the inverse clock signal CKn may transition to logical high at a second time point t2 and a fourth time point t4. The above transition of the clock signals CK, CKb, and CKn may be repeated.

When the input data IDTA input to an input node NDi at one time point between the first time point t1 and the second time point t2 are inverted through an input inverter IIV and is applied to the first node ND1, at the second time point t2 at which the delay clock signal CKb transitions to logical low and the inverse clock signal CKn transitions to logical high, the first transmission gate TG1 may be enabled, and thus, a voltage corresponding to the middle data MDTA may be applied to the third node ND3 by the first data inverter DIV1. Between the second time point t2 and the third time point t3, the first feedback inverter FIV1 may have a high-impedance state.

At the third time point t3 at which the delay clock signal CKb transitions to logical high and the inverse clock signal CKn transitions to logical low, the voltage of the third node ND3 may be inverted by the first feedback inverter FIV1 and may be applied to the second node ND2. Accordingly, the voltage of the third node ND3 may be maintained until the delay clock signal CKb again transitions to logical low and the inverse clock signal CKn again transitions to logical high.

In this case, at the third time point t3 at which the delay clock signal CKb transitions to logical high and the inverse clock signal CKn transitions to logical low, the second transmission gate TG2 may be enabled. As such, a voltage that is identical to the voltage of the third node ND3 may be applied to the fourth node ND4, and the voltage of the fourth node ND4 may be inverted by the second data inverter DIV2 and may be applied to the fifth node ND5. Between the third time point t3 and the fourth time point t4, the second feedback inverter FIV2 may have a high-impedance state.

At the fourth time point t4 at which the reference clock signal CK transitions to logical low and the inverse clock signal CKn transitions to logical high, the voltage of the fifth node ND5 may be inverted by the second feedback inverter FIV2 and may be applied to the fourth node ND4. Accordingly, the voltage of the fifth node ND5 may be maintained until the reference clock signal CK again transitions to logical high and the inverse clock signal CKn again transitions to logical low.

The voltage of the fifth node ND5, that is, inverse data of the output data ODTA may be inverted by an output inverter OIV. Accordingly, the output data ODTA whose voltage level is identical to that of the input data IDTA and which are maintained during an arbitrary period of the reference clock signal CK, for example, during one period of the reference clock signal CK may be output to an output node NDo.

An example in which the flip-flop FF according to an embodiment of the present disclosure includes the input inverter IIV and the output inverter OIV is illustrated in FIG. 2. However, even though the flip-flop FF does not include the input inverter IIV and the output inverter OIV, through simple circuit modification, the flip-flop FF may output the output data ODTA that are maintained during a given period(s) and have the same voltage level as the input data IDTA. Also, unless mentioned separately in the specification, the input data IDTA may be used with inverse data of the input data IDTA, or the output data ODTA may be used with inverse data of the output data ODTA.

Figure 5:
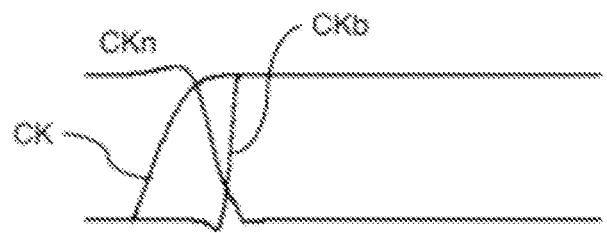
FIG. 5 is a diagram illustrating an output of a clock buffer according to an embodiment of the present disclosure in detail.

FIG. 5 is a diagram illustrating an output of a clock buffer according to an embodiment of the present disclosure in detail.

Referring to FIGS. 3 to 5, in terms of a digital signal, a result of performing an AND operation on outputs of the clock buffer CB according to an embodiment of the present disclosure, that is, the reference clock signal CK, the inverse clock signal CKn, and the delay clock signal CKb in all the time periods may be "1" or "0". However, in the event that the reference clock signal CK and the delay clock signal CKb transition to logical high as illustrated in FIG. 5, the low-to-high transition of the delay clock signal CKb may be delayed with respect to the low-to-high transition of the reference clock signal CK, or the delay clock signal CKb may transition to logical high while the inverse clock signal CKn is transitioning to logical low. In an embodiment, the clock buffer CB may include a delay chain of at least two inverters such as a first clock inverter CIV1 and a second clock inverter CIV2. When the reference clock signal CK travels through the delay chain of the first and second clock inverters CIV1 and CIV2, the reference clock signal CK may be delayed. For example, the first clock inverter CIV1 may receive the reference clock signal CK and output a delayed inverted signal of the reference clock signal CK as the inverse clock signal CKn, and the second clock inverter CIV2 may receive the inverse clock signal CKn and output a delayed inverted signal of the inverse clock signal CKn (or a delayed clock signal of the reference clock signal CK) as the delayed clock signal CKb.

Figure 6:
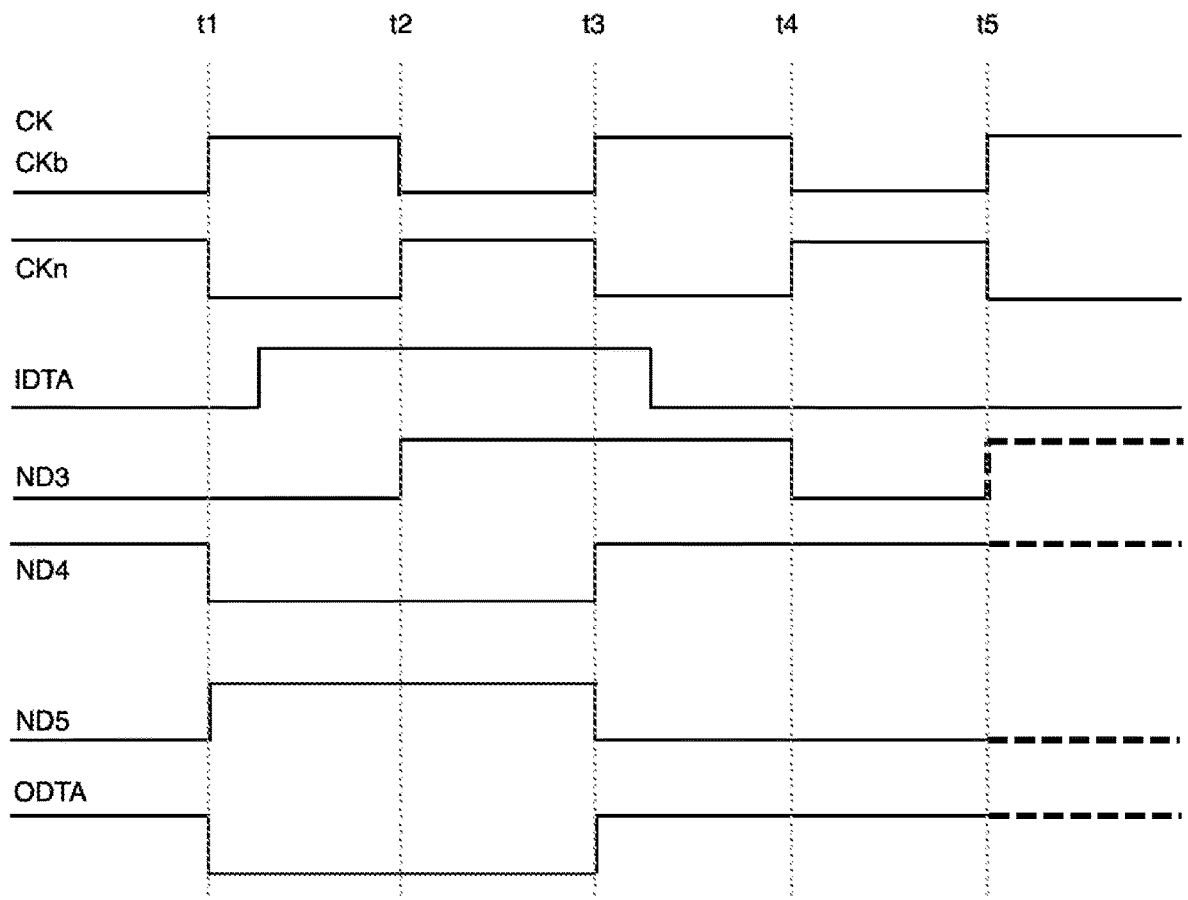
FIGS. 6 and 7 are diagrams illustrating examples of an abnormal operation in a slave latch of a flip-flop.
Figure 7:
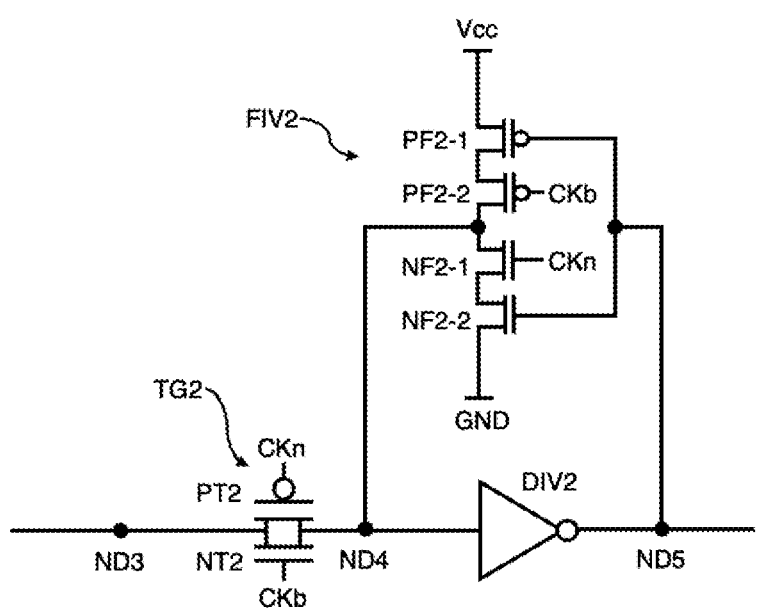

FIGS. 6 and 7 are diagrams illustrating examples of an abnormal operation in a slave latch of a flip-flop.

Referring to FIGS. 6 and 7, at the fifth time point t5 at which the delay clock signal CKb transitions to logical high while the inverse clock signal CKn is transitioning to the logical low like FIG. 5, the second PMOS transmission transistor PT2 and the second NMOS transmission transistor NT2 of the second transmission gate TG2 may be turned on, and thus, the voltage of the third node ND3 may be inverted and may be applied to the fifth node ND5.

In this case, as illustrated in FIG. 6, when the (2-2)-th PMOS feedback transistor PF2-2 of the second feedback inverter FIV2 is simultaneously turned off at a time point at which the second NMOS transmission transistor NT2 of the second transmission gate TG2 is turned on, the fighting between a pull-down operation and a pull-up operation may occur at the fourth node ND4. That is, there may be a transition time period during which a pull-up operation of the (2-2)-th PMOS feedback transistor PF2-2 does not end even though a pull-down operation of the second NMOS transmission transistor NT2 at the fourth node ND4 starts. In this case, the voltage of the fourth node ND4 may fail to be sufficiently pulled down to a required voltage.

As the power supply voltage decreases, a difference between a threshold voltage of a transistor and the power supply voltage may decrease. This may affect a driving capability of the transistor. For this reason, a minimum power supply voltage of a flip-flop or semiconductor device may be determined by a minimum voltage value permitted with reference to the second NMOS transmission transistor NT2.

According to the above bias condition, the voltage of the fourth node ND4 may become higher than the required voltage, and a current path from the fourth node ND4 to the third node ND3 may be formed. Accordingly, a voltage of logical high, instead of logical low, may be formed at the third node ND3 as marked by dotted lines. As a result, an abnormal operation where there are output the output data ODTA whose value is different from that of the input data IDTA may occur.

Referring to FIGS. 2 and 5, in the flip-flop FF according to an embodiment of the present disclosure, as the gating of the (2-2)-th PMOS feedback transistor PF2-2 may be performed by the reference clock signal CK preceding the inverse clock signal CKn, a time point at which the (2-2)-th PMOS feedback transistor PF2-2 is turned off, that is, a time point at which the second feedback path FP2 is disabled may precede a time point at which the second NMOS transmission transistor NT2 is turned on, that is, the second data path DP2 is enabled. That is, the pull-up operation of the second feedback inverter FIV2 may be disabled before the pull-down operation of the second transmission gate TG2 at the fourth node ND4 is enabled. Accordingly, the flip-flop FF according to an embodiment of the present disclosure may stably operate even at a low power. In addition, a circuit or system including the flip-flop FF according to an embodiment of the present disclosure may stably operate even at a low power.

The above description is given with reference to the control operation in the second latch LT2, that is, the case where the disable timing of the second feedback path FP2 precedes the enable timing of the second data path DP2, but the present disclosure is not limited thereto. The first latch LT1 according to an embodiment of the present disclosure may also be implemented such that the disable timing of the first feedback path FP1 precedes the enable timing of the first data path DP1.

Figure 8:
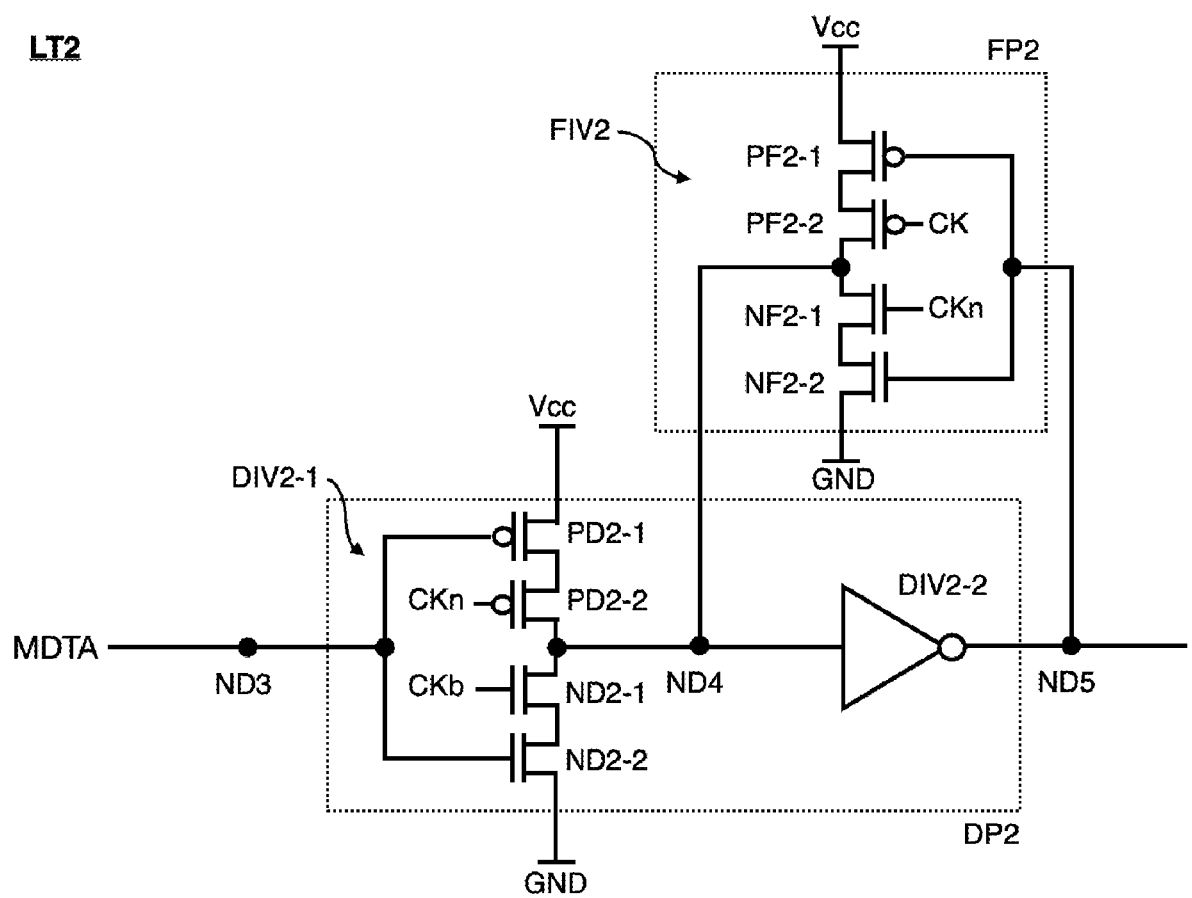
FIGS. 8 and 9 are diagrams illustrating a second latch according to an embodiment of the present disclosure.
Figure 9:
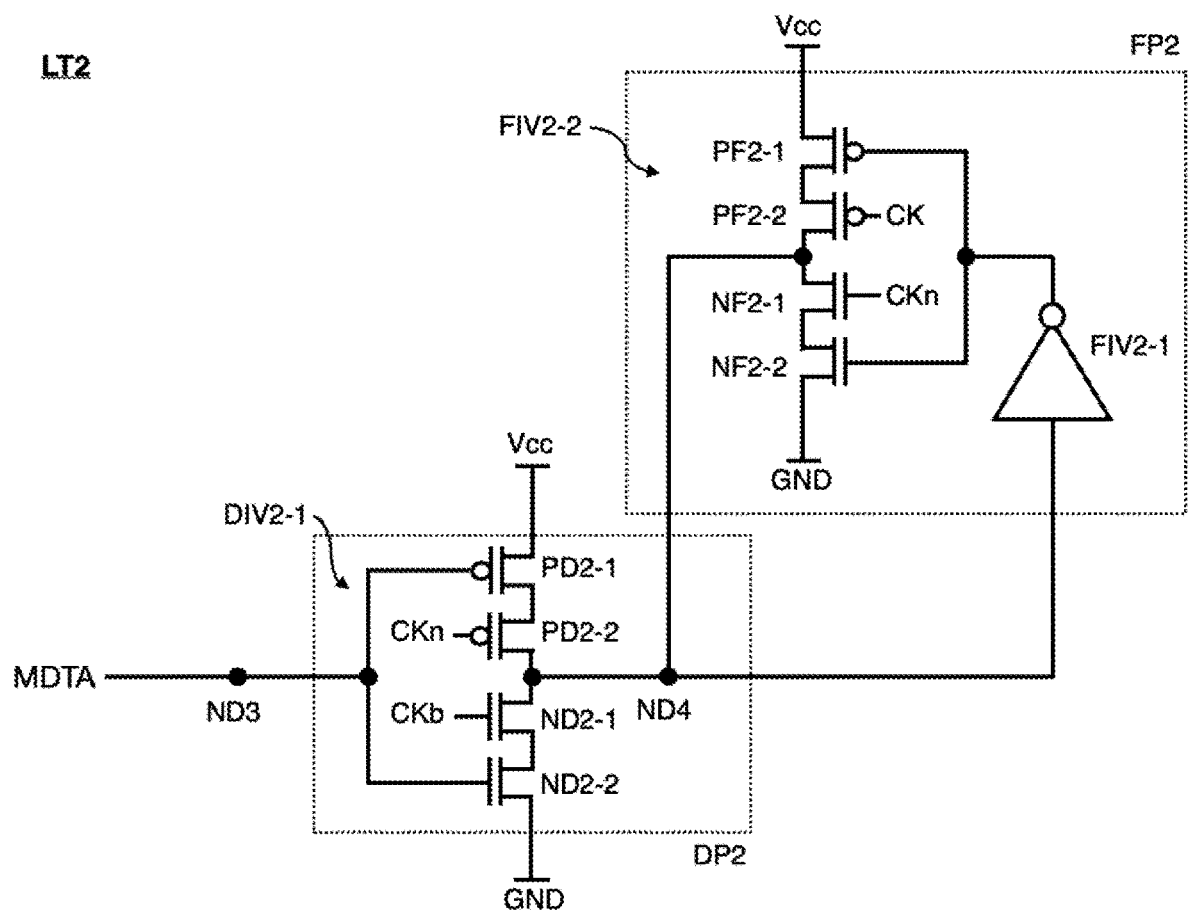

FIGS. 8 and 9 are diagrams illustrating a second latch according to an embodiment of the present disclosure.

First, referring to FIG. 8, the second latch LT2 of FIG. 8 may include the second data path DP2 and the second feedback path FP2 like the second latch LT2 of FIG. 2. However, the second data path DP2 of FIG. 2 may include the second transmission gate TG2 and the second data inverter DIV2, whereas the second data path DP2 of FIG. 8 may include a (2-1)-th data inverter DIV2-1 and a (2-2)-th data inverter DIV2-2. In an embodiment, the (2-1)-th data inverter DIV2-1 may be included in the second latch LT2 of FIG. 8 instead of the second transmission gate TG2 of FIG. 2.

The (2-1)-th data inverter DIV2-1 may be implemented with a three-phase inverter that inverts the voltage of the third node ND3, that is, the middle data MDTA so as to be applied to the fourth node ND4. For example, the (2-1)-th data inverter DIV2-1 may include a (2-1)-th PMOS data transistor PD2-1 and a (2-2)-th NMOS data transistor ND2-2 gated by the middle data MDTA, a (2-2)-th PMOS data transistor PD2-2 gated by the inverse clock signal CKn, and a (2-1)-th NMOS data transistor ND2-1 gated by the delay clock signal CKb.

The (2-2)-th data inverter DIV2-2 may be identical to the second data inverter DIV2 of FIG. 2.

Referring to FIG. 9, the second latch LT2 of FIG. 2 or 9 may include the second data path DP2 and the second feedback path FP2 like the second latch LT2 of FIG. 2.

The second data path DP2 of FIG. 2 may include the second transmission gate TG2 and the second data inverter DIV2, and the second data path DP2 of FIG. 8 may include the (2-1)-th data inverter DIV2-1 and the (2-2)-th data inverter DIV2-2. In contrast, the second data path DP2 of FIG. 9 may include only the (2-1)-th data inverter DIV2-1 and may apply the voltage of the third node ND3 to the fourth node ND4.

Also, the second feedback path FP2 of FIGS. 2 and 8 may include the second feedback inverter FIV2, whereas the second feedback path FP2 of FIG. 9 may include a (2-1)-th feedback inverter FIV2-1 and a (2-2)-th feedback inverter FIV2-2. The (2-1)-th feedback inverter FIV2-1 may invert an output of the (2-1)-th data inverter DIV2-1, that is, the voltage of the fourth node ND4 so as to be applied to the (2-2)-th feedback inverter FIV2-2.

The (2-2)-th feedback inverter FIV2-2 may be identical to the second feedback inverter FIV2 of FIG. 2. That is, the (2-2)-th feedback inverter FIV2-2 may include the (2-1)-th PMOS feedback transistor PF2-1 and the (2-2)-th NMOS feedback transistor NF2-2, the (2-2)-th PMOS feedback transistor PF2-2 gated by the reference clock signal CK, and the (2-1)-th NMOS feedback transistor NF2-1 gated by the inverse clock signal CKn. However, the (2-1)-th PMOS feedback transistor PF2-1 and the (2-2)-th NMOS feedback transistor NF2-2 of the second feedback inverter FIV2 of FIG. 2 or 8 may be gated by the voltage of the fifth node ND5, whereas the (2-1)-th PMOS feedback transistor PF2-1 and the (2-2)-th NMOS feedback transistor NF2-2 of FIG. 9 may be gated by the output of the (2-1)-th feedback inverter FIV2-1.

Compared to FIG. 2, in the case of FIGS. 8 and 9, inversion may be additionally performed on the second data path DP2 or the second feedback path FP2. As such, the output data ODTA may have the voltage level corresponding to the input data IDTA, as illustrated in FIG. 4, by performing an additional inversion operation on an input or output of the second data path DP2 or removing an existing inversion operation.

Only the second latch LT2 are described with reference to FIGS. 8 and 9, but the first latch LT1 may also be modified or replaced by identically applying the description given with reference to FIGS. 8 and 9 to the first latch LT1.

Figure 10:
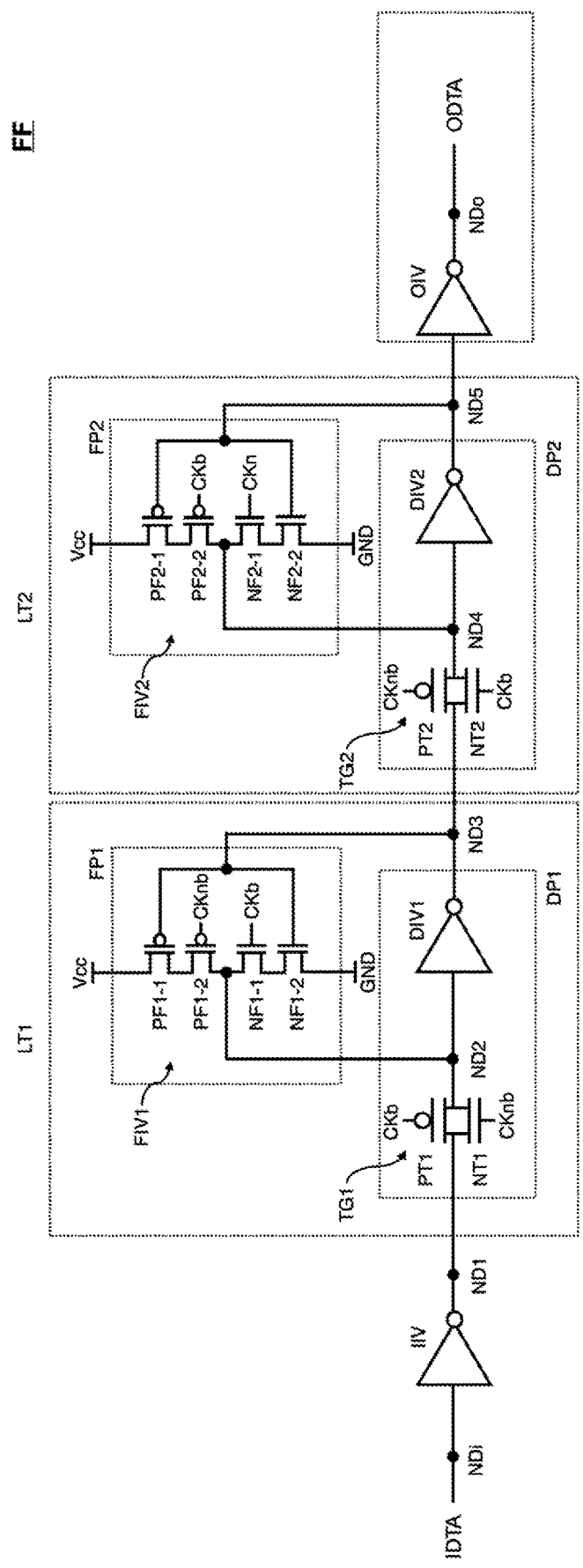
FIG. 10 is a diagram illustrating a flip-flop according to an embodiment of the present disclosure.
Figure 11:
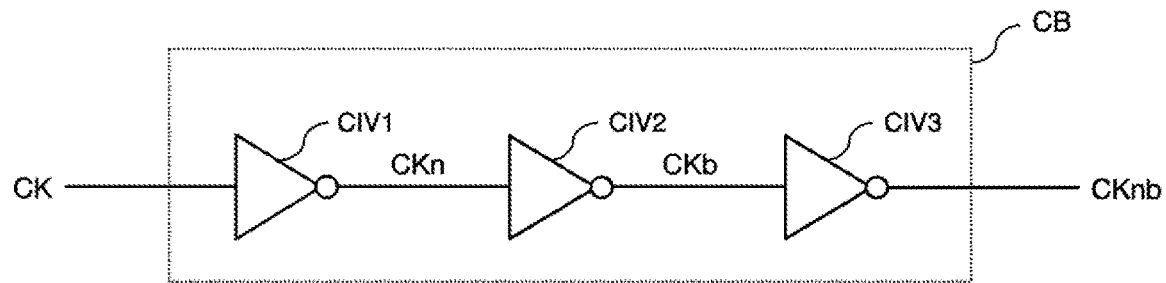
FIG. 11 is a diagram illustrating a clock buffer according to an embodiment of the present disclosure.

FIG. 10 is a diagram illustrating a flip-flop according to an embodiment of the present disclosure, and FIG. 11 is a diagram illustrating a clock buffer according to an embodiment of the present disclosure.

FIGS. 1, 10, and 11, the flip-flop FF according to an embodiment of the present disclosure may include the first latch LT1 and the second latch LT2. The first latch LT1 and the second latch LT2 may respectively include the first data path DP1 and the second data path DP2 that are enabled in response to the transmission signal XTM, and may respectively include the first feedback path FP1 and the second feedback path FP2 that are enabled in response to the first feedback signal XFB1 and the second feedback signal XFB2. In the flip-flop FF according to an embodiment of the present disclosure, the disable timing of the first feedback path FP1 may precede the enable timing of the first data path DP1, or the disable timing of the second feedback path FP2 may precede the enable timing of the second data path DP2. In this case, a stable operation may be performed even at a low power.

The transmission signal XTM, the first feedback signal) (FBI, and the second feedback signal XFB2 may be generated such that the disable timing of the first feedback path FP1 may precede the enable timing of the first data path DP1, or the disable timing of the second feedback path FP2 may precede the enable timing of the second data path DP2. As described above, the transmission signal XTM, the first feedback signal)(FBI, and the second feedback signal XFB2 may be generated in plurality so as to correspond to the structure and operations of the first data path DP1, the second data path DP2, the first feedback path FP1, and the second feedback path FP2.

The flip-flop FF according to an embodiment of the present disclosure may further include the clock buffer CB that receives the reference clock signal CK to generate the transmission signal XTM, the first feedback signal)(FBI, and the second feedback signal XFB2. The clock buffer CB may include the first clock inverter CIV1 that outputs the reference clock signal CK as the inverse clock signal CKn, the second clock inverter CIV2 that outputs the inverse clock signal CKn as the delay clock signal CKb, and a third clock inverter CIV3 that outputs the delay clock signal CKb as a delay inverse signal CKnb.

The transmission signal XTM may include the delay clock signal CKb and the delay inverse signal CKnb. In the case where the first latch LT1 is a master latch, the second latch LT2 is a slave latch, and the disable timing of the second feedback path FP2 is controlled to precede the enable timing of the second data path DP2, the first feedback signal XFB1 may also include the delay clock signal CKb and the delay inverse signal CKnb, and the second feedback signal XFB2 may include the inverse clock signal CKn and the delay clock signal CKb.

The first NMOS transmission transistor NT1 of the first transmission gate TG1, the second PMOS transmission transistor PT2 of the second transmission gate TG2, and the (1-2)-th PMOS feedback transistor PF1-2 of the first feedback inverter FIV1 may be gated by the delay inverse signal CKnb, and the first PMOS transmission transistor PT1 of the first transmission gate TG1, the second NMOS transmission transistor NT2 of the second transmission gate TG2, the (1-1)-th NMOS feedback transistor NF1-1 of the first feedback inverter FIV1, and the (2-2)-th PMOS feedback transistor PF2-2 of the second feedback inverter FIV2 may be gated by the delay clock signal CKb.

The (2-1)-th NMOS feedback transistor NF2-1 of the second feedback inverter FIV2 may be gated by the inverse clock signal CKn.

Figure 12:
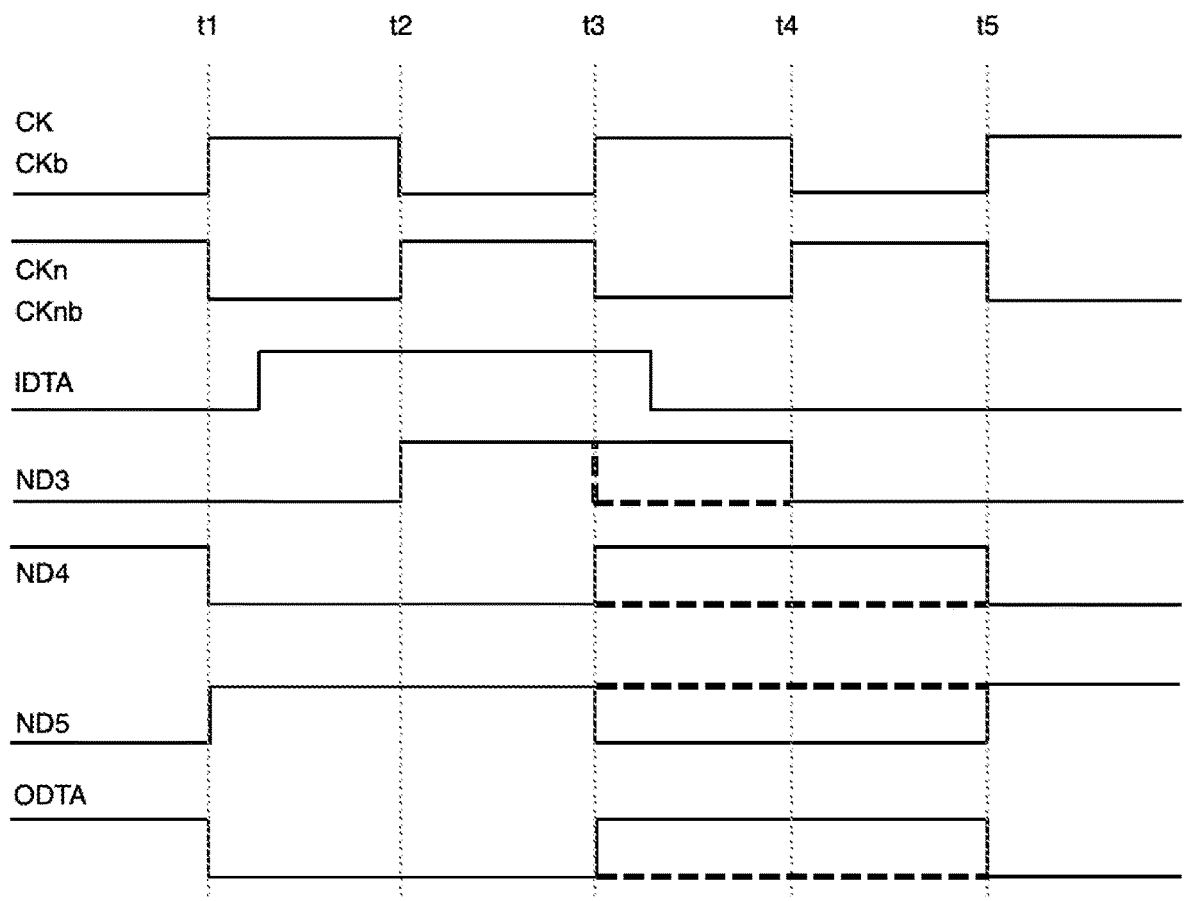
FIG. 12 is a diagram illustrating an operation of a flip-flop according to an embodiment of the present disclosure.

FIG. 12 is a diagram illustrating an operation of a flip-flop according to an embodiment of the present disclosure.

Referring to FIGS. 10, and 12, after the set-up operation is completed, an operation of the flip-flop FF of FIG. 10 may be identical to the operation of the flip-flop FF of FIG. 4. Similarly to the delays caused by clock inverters as described with reference to FIGS. 5 to 7, the high-to-low transition of the inverse clock signal CKn that gates the (2-1)-th NMOS feedback transistor NF2-1 of the second feedback inverter FIV2 at the third time point t3 may precede the high-to-low transition of the delay inverse signal CKnb that gates the second PMOS transmission transistor PT2 of the second transmission gate TG2, as much as a given time (e.g., by delays of two clock input inverters CIV2 and CIV3 in FIG. 11).

In this case, as the (2-1)-th NMOS feedback transistor NF2-1 of the second feedback inverter FIV2 is simultaneously turned off at a time point at which the second PMOS transmission transistor PT2 of the second transmission gate TG2 is turned on, the fighting may not occur at the fourth node ND4. That is, there may be a time period where the pull-down operation of the (2-1)-th NMOS feedback transistor NF2-1 does not end even though the pull-up operation of the second PMOS transmission transistor PT2 at the fourth node ND4 starts. In this case, the voltage of the fourth node ND4 may fail to be sufficiently pulled up to a required voltage. For example, in the event that the high-to-low transition of the inverse clock signal CKn at the third time point t3 (i.e., for disabling of the second feedback path FP2) precedes the high-to-low transition of the delay inverse signal CKnb (i.e., for enabling of the second data path DP2) by delays of two clock input inverters CIV2 and CIV3 as shown in FIG. 11, and the (2-1)-th NMOS feedback transistor NF2-1 of the second feedback inverter FIV2 is turned off before the second PMOS transmission transistor PT2 of the second transmission gate TG2 is turned on, the fighting between a pull-down operation and a pull-up operation may not occur at the fourth node ND4. When there is an overlap between a transition time period during which the pull-down operation of the (2-1)-th NMOS feedback transistor NF2-1 does not end and a transition time period during which the pull-up operation of the second PMOS transmission transistor PT2 at the fourth node ND4 starts, the fighting between a pull-down operation and a pull-up operation may occur and the voltage of the fourth node ND4 may fail to be sufficiently pulled up to a required voltage (e.g., a power supply voltage).

As the power supply voltage decreases, a difference between a threshold voltage of a transistor and the power supply voltage may decrease. This may affect a driving capability of the transistor. For this reason, a minimum power supply voltage of a flip-flop or semiconductor device may be determined by a minimum voltage value permitted with reference to the second PMOS transmission transistor PT2.

In the case where there is a time period where the pull-down operation of the (2-1)-th NMOS feedback transistor NF2-1 does not end even though the pull-up operation of the second PMOS transmission transistor PT2 at the fourth node ND4 starts, the voltage of the fourth node ND4 may become smaller than the required voltage. In this case, a great amount of current may flow from the third node ND3 to the fourth node ND4, compared to the case where the voltage of the fourth node ND4 is set to the required voltage. Accordingly, as marked by a dotted line after the third time point t3 of FIG. 12, a voltage of logical low, instead of logical high, may be formed at the third node ND3, thereby causing an abnormal operation where there are output the output data ODTA whose value is different from that of the input data IDTA.

The flip-flop FF according to an embodiment of the present disclosure may disable the pull-down operation of the second feedback inverter FIV2 before the pull-up operation of the second transmission gate TG2 is enabled and thus may stably operate even at a low power as marked by a solid line after the third time point t3 of FIG. 12. Also, a circuit or system including the flip-flop FF according to an embodiment of the present disclosure may stably operate at a low power.

Figure 13:
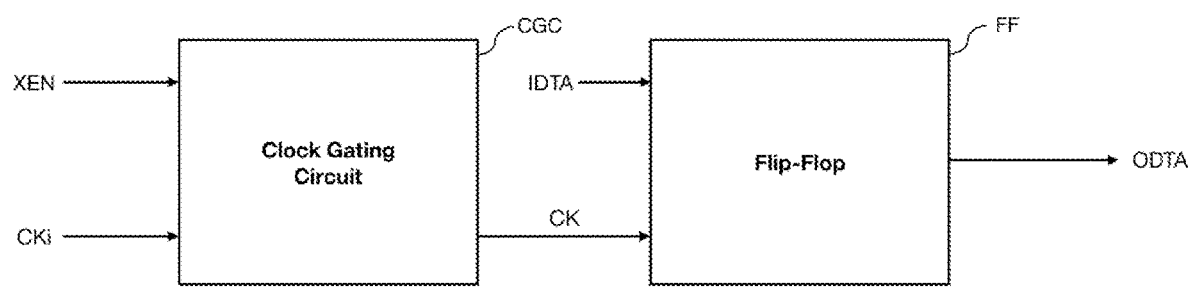
FIGS. 13 and 14 are diagrams illustrating a semiconductor device according to an embodiment of the present disclosure.
Figure 14:
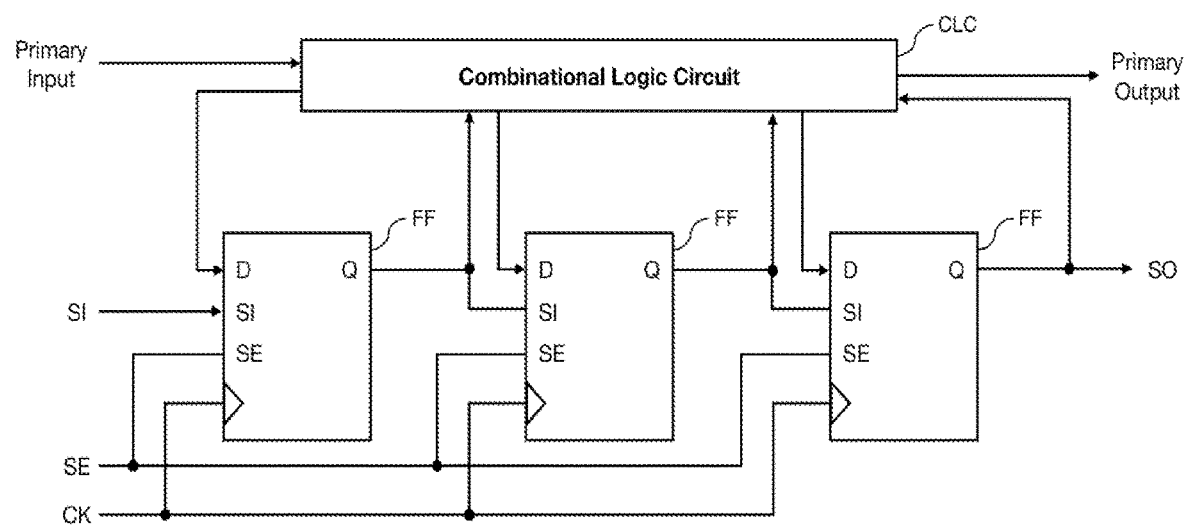

FIGS. 13 and 14 are diagrams illustrating a semiconductor device according to an embodiment of the present disclosure.

Referring to FIG. 13, the semiconductor device 100 according to an embodiment of the present disclosure may include the flip-flop FF and a clock gating circuit CGC. The flip-flop FF may correspond to the flip-flop FF of FIG. 1. The clock gating circuit CGC may perform a clock gating operation in which an input clock CKi is transferred or blocked by an enable signal XEN and may apply the input clock CKi as the reference clock signal CK to the flip-flop FF. Accordingly, the semiconductor device 100 according to an embodiment of the present disclosure may stably operate at a lower power.

Referring to FIG. 14, the semiconductor device 100 according to an embodiment of the present disclosure may include a plurality of flip-flops FF. Each of the plurality of flip-flops FF may correspond to the flip-flop FF of FIG. 1. The plurality of flip-flops FF may perform the same operation, or at least two or more of the plurality of flip-flops FF may perform different operations.

For example, as illustrated in FIG. 14, the semiconductor device 100 according to an embodiment of the present disclosure may include a scan chain circuit that is implemented with the plurality of flip-flops FF connected in a daisy-chain (i.e., wired in sequence) and generates a scan output SO for a combinational logic circuit CLC with respect to a scan input SI in response to a shift enable signal SE. The plurality of flip-flops FF may perform the scan operation on the combinational logic circuit CLC by maintaining an output of the combinational logic circuit CLC associated with the scan input SI during one period at each stage and transferring the output to the flip-flop FF of a next stage while feeding the output back to the combinational logic circuit CLC. For example, an output Q of each flip-flop FF may be connected to a scan input SI of its succeeding flip-flop and the combinational logic circuit CLC.

In this case, unlike FIG. 2, the flip-flop FF of FIG. 14 may receive corresponding data through not the input inverter IIV connected with the first node ND1 but a multiplexer (not illustrated) performing a multiplexing operation in response to the shift enable signal SE.

Figure 15:
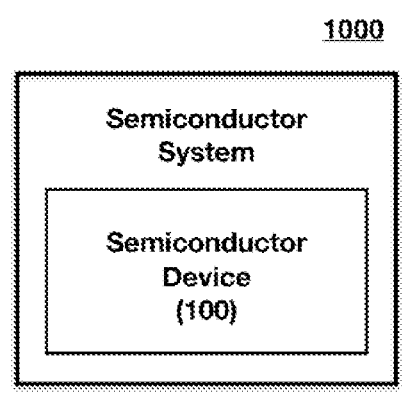
FIG. 15 is a drawing illustrating a semiconductor system according to an embodiment of the present disclosure.

FIG. 15 is a drawing illustrating a semiconductor system according to an embodiment of the present disclosure.

Referring to FIG. 15, a semiconductor system 1000 according to an embodiment of the present disclosure may include the semiconductor device 100 of FIG. 1. For example, the semiconductor system 1000 according to an embodiment of the present disclosure may refer to a processor or system on chip (SoC) that includes the semiconductor device 100 including the flip-flop FF of FIG. 1 and can temporarily store an operating result stably even at a low power. For example, the semiconductor system 1000 according to an embodiment of the present disclosure may be a low-power processor that includes the flip-flop FF and the clock gating circuit CGC of FIG. 13.

According to a semiconductor device and a semiconductor system of the present disclosure, it may be possible to make the reliability of operation high while operating at a low power.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:
1. A semiconductor device comprising:
at least one flip-flop including a first flip-flop, wherein the first flip-flop includes:
   a first latch including a first data path receiving input data in response to a transmission signal and outputting middle data, and a first feedback path feeding the middle data back to the first data path; and
   a second latch including a second data path receiving the middle data in response to the transmission signal and outputting output data, and a second feedback path feeding the output data back to the second data path, and
wherein at least one of the first feedback path and the second feedback path is disabled prior to enabling the first data path or the second data path,
wherein the flip-flop further includes:
a clock buffer configured to receive a reference clock signal, and generate an inverse clock signal and a delay clock signal from the reference clock signal as the transmission signal, and
wherein the second feedback path includes a second feedback inverter including a (2-1)-th PMOS feedback transistor and a (2-2)-th NMOS feedback transistor each gated by the output data, a (2-2)-th PMOS feedback transistor gated by the reference clock signal, and a (2-1)-th NMOS feedback transistor gated by the inverse clock signal.

2. The semiconductor device of claim 1,
wherein the second data path includes:
   a second transmission gate connected to the first latch and including a second PMOS transmission transistor gated by the inverse clock signal and a second NMOS transmission transistor gated by the delay clock signal; and
   a second data inverter connected to the second transmission gate and configured to invert the middle data transmitted from the second transmission gate and generate the output data.

3. The semiconductor device of claim 1,
wherein the second data path includes:
a (2-1)-th data inverter connected to the first latch and including a (2-1)-th PMOS data transistor and a (2-2)-th NMOS data transistor each gated by the middle data, a (2-2)-th PMOS data transistor gated by the inverse clock signal, and a (2-1)-th NMOS data transistor gated by the delay clock signal; and
a (2-2)-th data inverter connected to the (2-1)-th data inverter and configured to invert an output of the (2-1)-th data inverter and generate the output data.

4. The semiconductor device of claim 1,
wherein the first data path includes:
   a first transmission gate including a first PMOS transmission transistor gated by the delay clock signal and a first NMOS transmission transistor gated by the inverse clock signal; and
   a first data inverter connected to the first transmission gate and configured to invert the input data transmitted from the first transmission gate and generate the middle data.

5. The semiconductor device of claim 4,
wherein the first feedback path includes:
   a first feedback inverter including a (1-1)-th PMOS feedback transistor and a (1-2)-th NMOS feedback transistor each gated by the middle data, a (1-2)-th PMOS feedback transistor gated by the inverse clock signal, and a (1-1)-th NMOS feedback transistor gated by the delay clock signal.

6. The semiconductor device of claim 1,
wherein the clock buffer includes a first clock inverter and a second clock inverter connected with each other in series,
wherein the first clock inverter is configured to receive the reference clock signal and generate the inverse clock signal; and
wherein the second clock inverter is configured to receive the inverse clock signal and generate the delay clock signal.

7. The semiconductor device of claim 1, further comprising:
   a clock gating circuit configured to receive an input clock signal and output, in response to an enable signal, the input clock signal as the reference clock signal.

8. The semiconductor device of claim 1, further comprising:
   a combinational logic circuit,
   wherein the at least one flip-flop includes a plurality of first flip-flops connected with each other in series, the plurality of first flip-flops including the first flip-flop,
   wherein an output of each first flip-flop of the plurality of first flip-flops is connected to the combinational logic circuit to constitute a scan chain circuit, and
   wherein the scan chain circuit is configured to receive a scan input and generate, in response to a shift enable signal, to generate a scan output.

9. A semiconductor device comprising:
at least one D flip-flop including a first D flip-flop,
wherein the first D flip-flop includes:
a first transmission gate gated by a transmission signal and configured to transmit input data of a first node to a second node;
a master latch including:
   a first data inverter configured to invert the input data of the second node and output the input data as middle data to a third node; and
   a first feedback inverter connected to the first data inverter and configured to feed the middle data of the third node back to the second node;
a second transmission gate gated by the transmission signal and configured to transmit the middle data of the third node to a fourth node; and
a slave latch including:
   a second data inverter connected to the fourth node and configured to invert the middle data of the fourth node and output the middle data of the fourth node as output data to a fifth node; and
   a second feedback inverter connected to the fourth node and the fifth node and configured to feed the output data of the fifth node back to the fourth node, and
wherein a pull-up operation of the second feedback inverter is disabled before a pull-down operation of the second transmission gate at the fourth node is enabled; and
a clock buffer configured to receive a reference clock signal and generate an inverse clock signal and a delay clock signal from the reference clock signal as the transmission signal,
wherein the second feedback inverter includes:
   a (2-1)-th PMOS feedback transistor including a first source/drain connected with a power supply voltage and a gate connected with the fifth node; and
   a (2-2)-th PMOS feedback transistor including a first source/drain connected with a second source/drain of the (2-1)-th PMOS feedback transistor, a second source/drain connected with the fourth node, and a gate connected with the reference clock signal.

10. The semiconductor device of claim 9,
wherein the first transmission gate includes:
- a first PMOS transmission transistor gated by the delay clock signal; and
- a first NMOS transmission transistor gated by the inverse clock signal, and wherein the second transmission gate includes:
- a second PMOS transmission transistor gated by the inverse clock signal; and
- a second NMOS transmission transistor gated by the delay clock signal.

11. The semiconductor device of claim 10,
wherein the second feedback inverter further includes:
- a (2-2)-th NMOS feedback transistor including a first source/drain connected with a ground voltage and a gate connected with the fifth node; and
- a (2-1)-th NMOS feedback transistor including a first source/drain connected with the fourth node, a second source/drain connected with a second source/drain of the (2-2)-th NMOS feedback transistor, and a gate connected with the inverse clock signal.

12. A semiconductor system including a semiconductor device,
wherein the semiconductor device includes:
- at least one flip-flop including a first flip-flop, wherein the first flip-flop includes:
- a first latch including a first data path receiving input data in response to a transmission signal and outputting middle data, and a first feedback path feeding the middle data back to the first data path;
- a second latch including a second data path receiving the middle data in response to the transmission signal and outputting output data, and a second feedback path feeding the output data back to the second data path, wherein at least one of the first feedback path and the second feedback path is disabled prior to enabling the first data path or the second data path; and a clock buffer configured to receive a reference clock signal and generate an inverse clock signal and a delay clock signal from the reference clock signal as the transmission signal, wherein the second feedback path includes a second feedback inverter including a (2-1)-th PMOS feedback transistor and a (2-2)-th NMOS feedback transistor each gated by the output data, a (2-2)-th PMOS feedback transistor gated by the reference clock signal, and a (2-1)-th NMOS feedback transistor gated by the inverse clock signal.

* * * * *